(12) United States Patent
Zhou et al.

(10) Patent No.: US 12,300,653 B2
(45) Date of Patent: May 13, 2025

(54) ELECTRONICS ASSEMBLIES WITH POWER ELECTRONIC DEVICES AND THREE-DIMENSIONALLY PRINTED CIRCUIT BOARDS HAVING REDUCED JOULE HEATING

(71) Applicant: Toyota Motor Engineering & Manufacturing North America, Inc., Plano, TX (US)

(72) Inventors: Feng Zhou, Ann Arbor, MI (US); Yanghe Liu, Ann Arbor, MI (US); Hiroshi Ukegawa, South Lyon, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 272 days.

(21) Appl. No.: 17/701,086

(22) Filed: Mar. 22, 2022

(65) Prior Publication Data

US 2023/0307406 A1 Sep. 28, 2023

(51) Int. Cl.
*H01L 23/00* (2006.01)
*H01L 23/373* (2006.01)
(Continued)

(52) U.S. Cl.
CPC .............. *H01L 24/24* (2013.01); *H01L 24/25* (2013.01); *H01L 24/82* (2013.01); *H01L 25/072* (2013.01);
(Continued)

(58) Field of Classification Search
CPC .. H05K 7/2089; H05K 7/20927; H05K 7/209; H05K 1/0206; H05K 1/0204;
(Continued)

(56) References Cited

U.S. PATENT DOCUMENTS 7,570,008 B2 * 8/2009 Inaba .................... H02M 7/003
361/33
8,410,371 B2 * 4/2013 Andrews ............... H01L 33/642
361/720

(Continued)

FOREIGN PATENT DOCUMENTS

CN 105813377 A 7/2016
CN 205657909 U 10/2016
(Continued)

*Primary Examiner* — Jacob R Crum
*Assistant Examiner* — Matthew Sinclair Muir
(74) *Attorney, Agent, or Firm* — Dinsmore & Shohl LLP (57) ABSTRACT

In one embodiment, an electronics assembly includes a cold plate assembly having a first surface, at least one power electronic device disposed within a recess on the first surface of the cold plate assembly, and a printed circuit board disposed on a surface of the at least one power electronic device. The printed circuit board includes a first insulation layer, a second insulation layer, an electrically conductive power layer between the first insulation layer and the second insulation layer, a first set of thermal vias extending from the electrically conductive power layer and toward the first surface of the cold plate assembly, and a second set of thermal vias extending from the first surface of the cold plate assembly toward the electrically conductive power layer. The first set of thermal vias is electrically isolated from the second set of thermal vias.

17 Claims, 9 Drawing Sheets

(51) Int. Cl.
*H01L 25/00* (2006.01)
*H01L 25/07* (2006.01)
*H01L 25/16* (2023.01)
*H05K 7/20* (2006.01)

(52) U.S. Cl.
CPC .............. *H01L 25/16* (2013.01); *H01L 25/50* (2013.01); *H05K 7/2089* (2013.01); *H01L 23/3735* (2013.01); *H01L 2224/24011* (2013.01); *H01L 2224/24137* (2013.01); *H01L 2224/244* (2013.01); *H01L 2224/245* (2013.01); *H01L 2224/2512* (2013.01); *H01L 2224/82101* (2013.01); *H01L 2924/01047* (2013.01); *H01L 2924/1517* (2013.01)

(58) Field of Classification Search
CPC ......... H01L 24/24; H01L 24/25; H01L 25/16; H01L 25/50; H01L 23/3735; H01L 2224/24137; H01L 23/3736; H01L 23/3672
See application file for complete search history.

(56) References Cited

U.S. PATENT DOCUMENTS

| | | | |
|---|---|---|---|
| 8,872,328 B2* | 10/2014 | Delgado | H01L 23/13 |
| | | | 257/E23.08 |
| 9,123,697 B2* | 9/2015 | Miyazawa | H01L 23/473 |
| 9,148,946 B1 | 9/2015 | Singh et al. | |
| 9,865,529 B2* | 1/2018 | Sato | H01L 23/3736 |
| 10,462,937 B1* | 10/2019 | Louco | H05K 7/209 |
| 10,701,796 B2 | 6/2020 | Chuah et al. | |
| 2004/0184272 A1* | 9/2004 | Wright | H05K 1/0206 |
| | | | 257/E23.105 |
| 2012/0218714 A1* | 8/2012 | Robert | H05K 1/0203 |
| | | | 361/713 |
| 2014/0138075 A1* | 5/2014 | Yang | H01L 23/473 |
| | | | 165/185 |
| 2015/0201499 A1 | 7/2015 | Shinar | |
| 2018/0124916 A1* | 5/2018 | Hattori | H05K 1/0298 |

FOREIGN PATENT DOCUMENTS

| | | |
|---|---|---|
| DE | 102018104312 A1 | 8/2019 |
| WO | 2018031186 A1 | 2/2018 |

* cited by examiner

ELECTRONICS ASSEMBLIES WITH POWER ELECTRONIC DEVICES AND THREE-DIMENSIONALLY PRINTED CIRCUIT BOARDS HAVING REDUCED JOULE HEATING

TECHNICAL FIELD

The present specification generally relates to electronic assemblies and, more particularly, to electronics assemblies having power electronic devices and three-dimensionally printed circuit boards and reduced joule heating.

BACKGROUND

For future electrified vehicles, especially autonomous driving vehicles for mobile service, compactness of the electric drive train is desired. As technology gradually changes from Si device to SiC device for power electronics, the heat flux at the die level increases due to smaller device footprint. All the layers between the heat source (power device) and heat sink (cold plate) contribute to the overall thermal resistance.

Present configurations for compact power electronics assemblies, such as those used in electrified vehicles, are insufficient as removing heat to keep components within operational parameters.

Accordingly, a need exists for alternative compact electronic devices capable of removing heat generated by power electronic devices.

SUMMARY

These and additional features provided by the embodiments described herein will be more fully understood in view of the following detailed description, in conjunction with the drawings.

In one embodiment, an electronics assembly includes a cold plate assembly having a first surface, at least one power electronic device disposed within a recess on the first surface of the cold plate assembly, and a printed circuit board disposed on a surface of the at least one power electronic device. The printed circuit board includes a first insulation layer, a second insulation layer, an electrically conductive power layer between the first insulation layer and the second insulation layer, a first set of thermal vias extending from the electrically conductive power layer and toward the first surface of the cold plate assembly, and a second set of thermal vias extending from the first surface of the cold plate assembly toward the electrically conductive power layer. The first set of thermal vias is electrically isolated from the second set of thermal vias.

In another embodiment, an electronics assembly includes a cold plate assembly having a first surface and six recesses within the first surface, three pairs of power electronic devices disposed within the six recesses, each power electronic device comprising a collector and an emitter, and a printed circuit board disposed on a surface of the power electronic device. The printed circuit board includes a first insulation layer, a second insulation layer, and for each pair of power electronic devices, an electrically conductive output power layer between the first insulation layer and the second insulation layer, wherein the electrically conductive output power layer is electrically coupled to the collector of one power electronic device of the pair of power electronic devices and the emitter of the other power electronic device of the pair of power electronic devices. The printed circuit board further includes an electrically conductive positive power layer between the first insulation layer and the second insulation layer, wherein the electrically conductive positive power layer is electrically coupled to the collector of a first power electronic device of each of the three pairs of power electronic devices, and an electrically conductive negative power layer between the first insulation layer and the second insulation layer, wherein the electrically conductive negative power layer is electrically coupled to the emitter of a first power electronic device of each of the three pairs of power electronic devices. The printed circuit board also includes a first set of thermal vias extending from one or more of the electrically conductive positive power layer, the electrically conductive negative power layer, and one or more of the electrically conductive output power layers, and a second set of thermal vias extending from the first surface of the cold plate assembly, wherein the first set of thermal vias is electrically isolated from the second set of thermal vias.

In yet another embodiment, a method of fabricating an electronics assembly includes positioning a power electronic device within a recess on a surface of a cold plate assembly, and three dimensionally printing a first layer on the surface of the cold plate assembly and a surface of the power electronic device, wherein the first layer includes an insulation material, a first set of thermal vias within the insulation material and extending from a surface of the first layer toward the surface of the cold plate assembly, and a second set of thermal vias within the insulation material and extending from the surface of the cold plate assembly toward the surface of the first layer. The first set of thermal vias is electrically isolated from the second set of thermal vias. The method further includes three dimensionally printing a second layer on the surface of the first layer, wherein the second layer is an electrically conductive material that defines an electrically conductive power layer that contacts the first set of thermal vias, and three dimensionally printing a third layer on the first layer, wherein the third layer is an electrically insulating material.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the appended figures, embodiments of the present disclosure are directed to electronic assemblies and methods for fabricating electronics assemblies.

There is a desire to reduce the overall size of the electric drive train of electrified vehicles, such as hybrid vehicles, plug-in hybrid vehicles, and battery electric vehicles. There is also a desire to change from Si power electronic devices to SiC power electronic devices. In SiC power electronic devices, the heat flux at the die level increases due to the smaller device footprint. In embodiments, to reduce the overall size of the electronic assembly including the power electronic devices as well as to reduce the thermal resistance, the printed circuit boards of the electronic assemblies described herein are three-dimensionally printed directly on a surface of a cold plate assembly and the power electronic devices themselves. Power electronic devices are bonded to a copper S-Cell defined by a direct bonded metal substrate, and the power electronic assemblies defined by the bonded power electronic devices and direct metal bonded substrates are bonded to a surface of the cold plate assembly. The power electronic devices are substantially flush with the surface of the cold plate assembly, thereby enabling three-dimensional printing of the circuit board on the surface of the cold plate assembly.

However, the properties of the three-dimensionally printed conductor and insulation materials are quite different from the properties of the typical printed circuit board materials, such as FR4 as the insulation material and copper as the conductor material. Two of the properties, electric conductivity of the conductor and thermal conductivity of the insulation layer, plays an important role when the printed circuit board layout is designed. For power device embedded printed circuit boards, high current is passed through the power layer which results in joule heating of the conductor. The three-dimensionally printed conductor usually has lower electrical conductivity compared to copper, e.g., silver ink can reach 30% of copper conductivity, and the insulation layer usually has lower thermal conductivity compared to typical printed circuit board insulation material, e.g., dielectric ink is about half of that of FR4. Therefore, for the same printed circuit board layout at the same power level, the power layer of the three-dimensionally printed version would have higher joule heating and more difficulty in dissipating heat than a traditional laminated printed circuit board.

Various embodiments for compact electronics assemblies having power electronic devices and three-dimensionally printed circuit boards with reduced joule heating are described in detail below.

Figure 1:
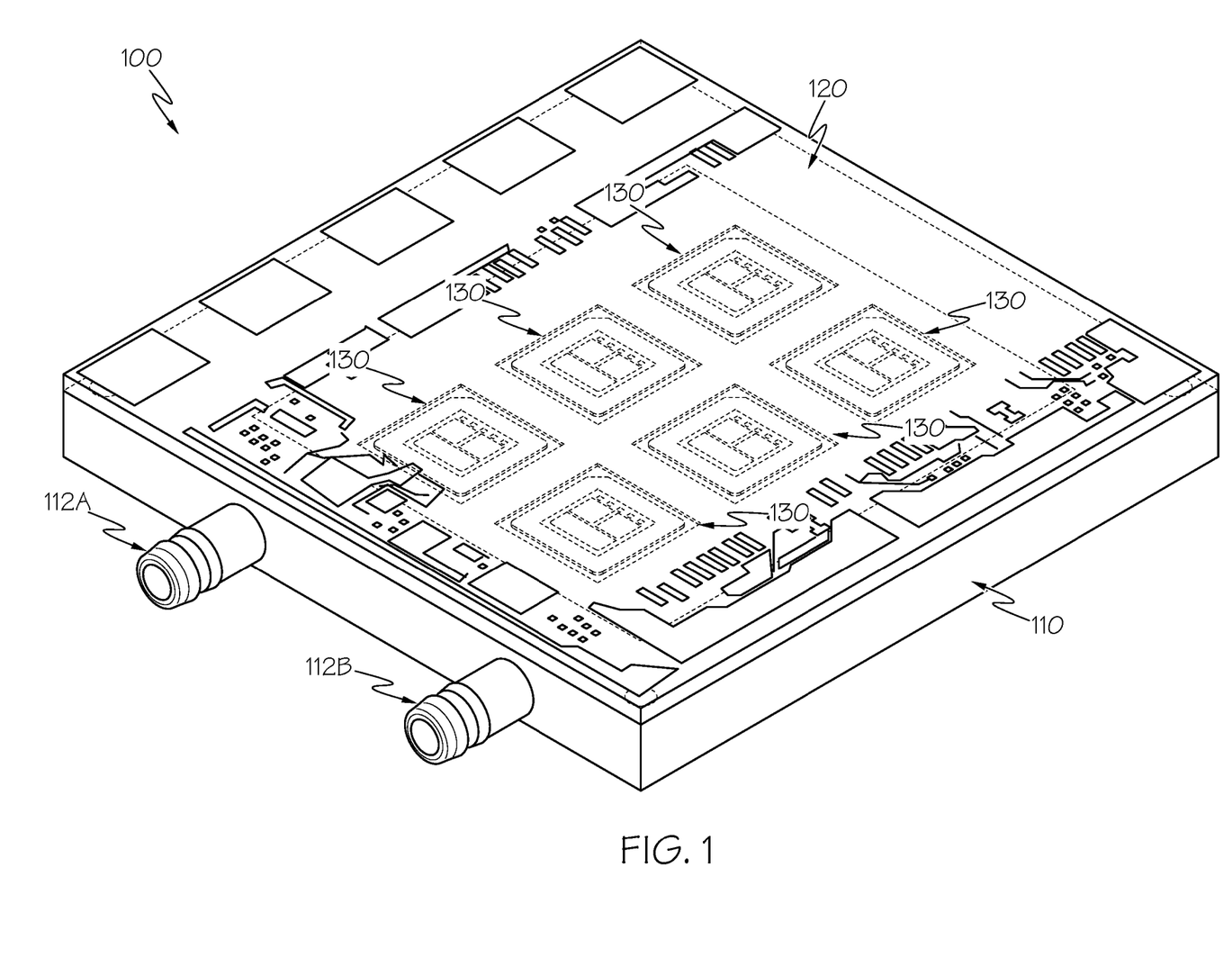
FIG. 1 schematically depicts a perspective view of an example electronics assembly according to one or more embodiments described and illustrated herein.

Referring now to FIG. 1, an example electronics assembly 100 is schematically illustrated. The electronics assembly 100 may be configured as an inverter operable to convert direct current (DC) into alternating current (AC) to power an electric machine, such as an electric motor of an electric vehicle. For example, in an electric vehicle, the electronics assembly 100 may receive input voltage from a battery or other DC source (not shown) and, by way of a plurality of power electronic devices (i.e., switches), convert the DC electricity to one or more phases of AC electricity to control the motor (not shown).

The example electronics assembly 100 includes a cold plate assembly 110 having a fluid inlet 112A and a fluid outlet 112B, a plurality of power electronic assemblies 130 disposed within a surface 118 of the cold plate assembly 110, and a printed circuit board 120 that is three-dimensionally printed on the surface 118 of the cold plate assembly and the plurality of power electronic assemblies 130. The electronic assembly further includes other various electronic devices provided on the printed circuit board 120, such as gate drive components, for example.

As described in more detail below, the cold plate assembly 110 includes an internal chamber 116 (FIG. 3A) that is fluidly coupled to the fluid inlet 112A and the fluid outlet 112B such that cooling fluid enters the chamber 116 by way of the fluid inlet 112A and exits the chamber 116 by way of the fluid outlet 112B. Warmed cooling fluid exiting the fluid outlet 112B may be provided to a heat exchanger where it is cooled and recycled through the cold plate assembly 110 again in a closed-loop system.

The electronics assembly 100 utilizes a plurality of power layers that are three-dimensionally printed within the printed circuit board 120 such that the plurality of power layers are embedded within the printed circuit board 120. As used herein "embedded" means that the plurality of power layers have insulating printed circuit board material on each major surface of the plurality of power layers. The power layers provide electrical connections to the plurality of power electronic assemblies 130 to provide both DC electricity to the plurality of power electronic assemblies 130 and output connections to provide switched AC electricity to an electric machine.

Figure 2:
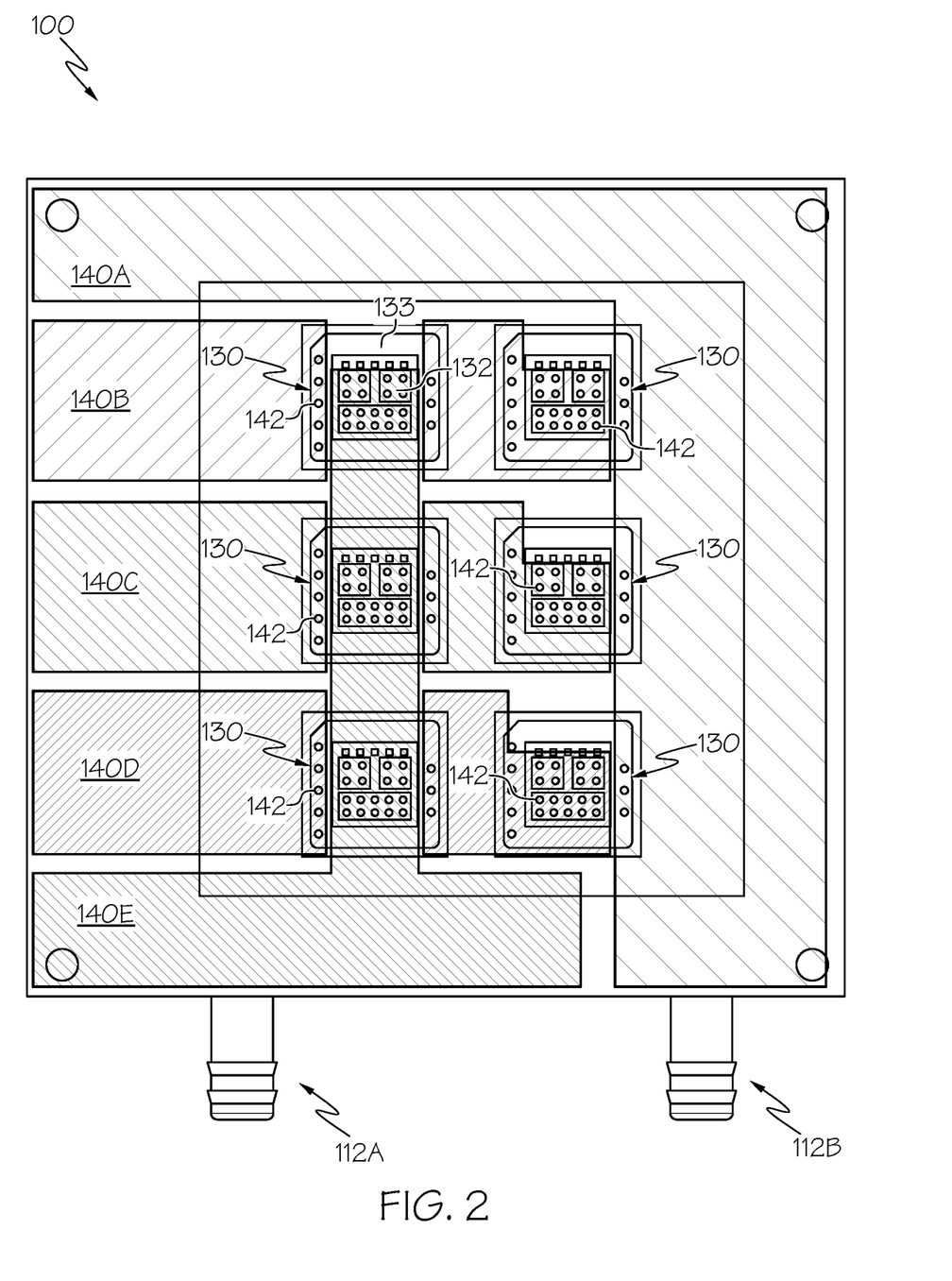
FIG. 2 schematically depicts a top view of the example electronic assembly of FIG. 1 showing a power layer layout according to one or more embodiments described and illustrated herein.

Referring now to FIG. 2, five power layers 140A-140E of the electronics assembly 100 of FIG. 1 are illustrated. The power layers 140A-140E are fabricated from an electrically conductive material capable of being three-dimensionally printed. As a non-limiting example, the power layers 140A-140E may be printed using a silver nanoparticle ink. As a further non-limiting example, the power layers 140A-140E may be printed using AgCite 90072 silver nanoparticle ink sold by Nano Dimension of Sunrise, FL. However, silver nanoparticle ink has less electrical conductivity than copper (about 30% less) and less thermal conductivity than copper (about 50% less). Thus, the area of each power layer 140A-140E should be maximized to lower electrical and thermal resistance within the electronics assembly 100.

An electrically conductive positive power layer 140A is provided and makes electrical connection to the appropriate power electronic assemblies 130 by way of electrical vias 142. The electrically conductive positive power layer 140A is operable to be electrically coupled to a positive terminal of a power source, such as a battery. As shown in FIG. 2, the plurality of power electronic assemblies 130 are arranged in three pairs, with each pair providing a pair of switching devices for each phase of an electric machine. As a non-limiting example, the electrical vias 142 electrically couple the positive power layer 140A to the collector of a first power electronic device 132 of the three pairs of power electronic assemblies 130.

An electrically conductive negative power layer 140E is provided and makes electrical connection to the appropriate power electronic assemblies 130 by way of electrical vias 142. The electrically conductive negative power layer 140E is operable to be electrically coupled to a negative terminal of a power source, such as a battery. As a non-limiting example, the electrical vias 142 electrically couple the negative power layer 140E to the emitter of a second power electronic device 132 of the three pairs of power electronic assemblies 130.

Three electrically conductive output power layers 140B-140D are provided and make electrical connection to the appropriate power electronic assemblies by way of electrical vias 142. The electrical vias 142 electrically couple the three output power layers 140B-140D to the collector of one power electronic device 132 of the pair of power electronic assemblies 130 and the emitter of the other power electronic device 132 of the pair of power electronic assemblies 130.

Figure 3A:
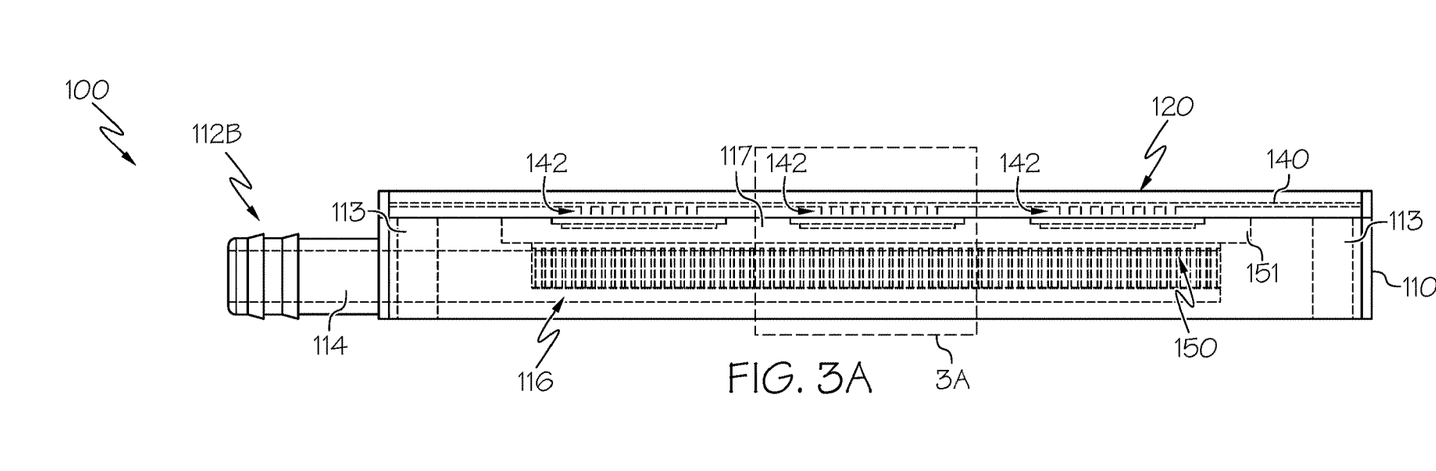
FIG. 3A schematically depicts a side view of the electronic assembly shown in FIG. 1 according to one or more embodiments described and illustrated herein.

FIG. 3A illustrates a side, transparent view of the electronics assembly 100 of FIG. 1. The cold plate assembly 110 includes an outlet manifold 114 fluidly coupled to an internal chamber 116, and similarly an inlet manifold (not visible) fluidly coupled to the internal chamber 116. An array of fins 150 extending in a first lateral direction are provided within the chamber 116 to increase surface area and thermal transfer of heat flux from the power electronic devices 132 to the cooling fluid within the chamber 116.

The cold plate assembly 110 further includes fastening features 113 configured as holes to receive fasteners to secure the electronics assembly 100 to other components, such as an electric motor, for example. The power electronic assembles 130 are disposed in recesses 119 on the surface 118 of the cold plate assembly 110. A top surface of the power electronic assembles 130 is substantially flush with the surface 118 of the cold plate assembly 110 so that the printed circuit board 120 can be three-dimensionally printed on the surface 118 and the power electronic assemblies 130. A power layer 140, which may be any of the specific power layers 140A-140E depicted in FIG. 2, is embedded within the printed circuit board 120. Electrical vias 142 electrically couple the power layer 140 to a power electronic device 132 of the power electronic assembly 130.

Figure 3B:
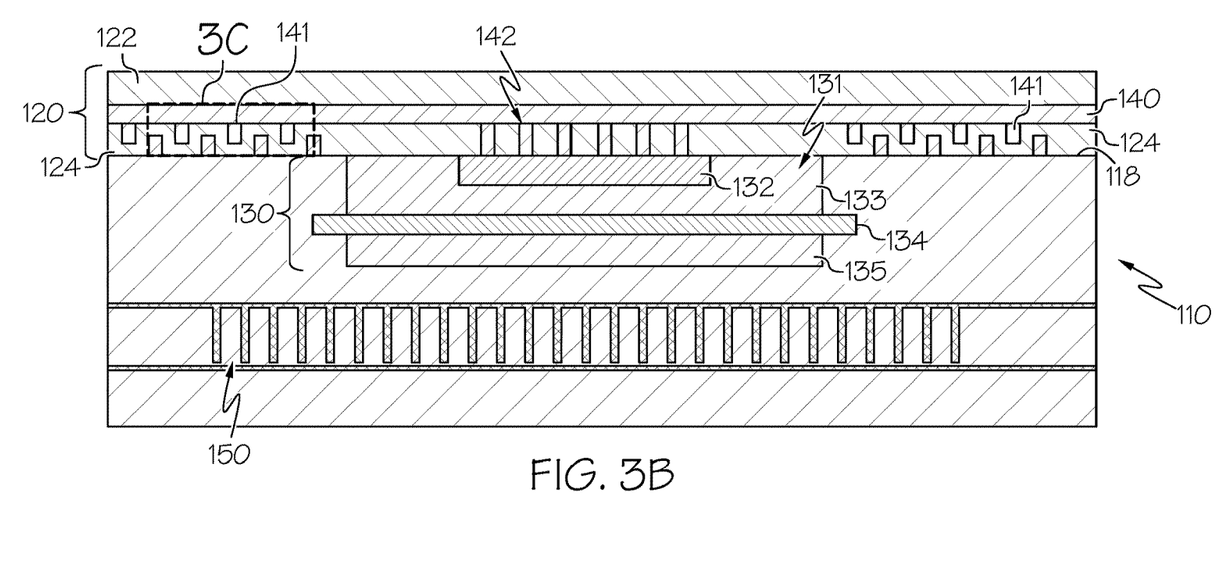
FIG. 3B schematically depicts a close-up view of a power electronic assembly and power layer of the electronics assembly shown in FIG. 3A according to one or more embodiments described and illustrated herein.

FIG. 3B schematically illustrates a close-up view of the dashed box 3B of FIG. 3A. FIG. 3B illustrates the power electronic assembly 130 in greater detail. The power electronic assembly includes a power electronic device 132 and a direct bonded metal substrate 131 comprising a first metal layer 133, an insulation substrate 134, and a second metal layer 135. The insulation substrate may be a ceramic, such as alumina, for example. The first metal layer 133 and the second metal layer 135 may be made from copper, for example, to provide a direct-bonded copper substrate.

The first metal layer 133 as a recess 136 dimensioned to receive the power electronic device 132 such that a top surface of the power electronic device 132 is substantially flush with a surface 118 of the cold plate assembly 110.

Thus, the first metal layer 133 acts as an S-Cell for the power electronic device 132. Electrical connections to contacts on an underside of the power electronic device 132 may be made by way of the first metal layer 133. In FIG. 3A, electrical connection between the top contacts on the power electronic device 132 and the power layer 140 are made by way of electrical vias 142. It should be understood that electrical vias 142 may also make electrical connection to a power layer and underside contacts of the power electronic device 132 by way of the first metal layer 133 of the direct bonded metal substrate 131.

As stated above, the reduced thermal conductivity of the three-dimensional printing materials for the electrically conductive components (e.g., the power layers 140 and the electrical vias) and the insulating material, the electronics assembly 100 has higher joule heating and the heat that is generated by the power electronic devices 132 is more difficult to dissipate as compared to packages using traditional laminated printed circuit boards. The insulation layers 122, 124 fabricated from three-dimensional printing material also typically have a lower thermal conductivity than traditional laminate printed circuit boards. For example, the dielectric ink 1092 sold by Nano Dimension has a thermal conductivity that is half that of FR4

To decrease the thermal resistance, particularly between the various power layers 140 (which may generate heat due to the electrical resistance and the high current flowing through the power layers 140) and the cold plate assembly 110, embodiments of the present disclosure provide for enhanced thermal paths between the power layers 140 and the cold plate assembly 110. Because the top surfaces of the S-Cell (i.e., the first metal layer 133) and the power electronic device 132 are flush with the surface 118 of the cold plate assembly 110, there is only one insulation layer 124 between the power layers 140 and the cold plate assembly 110.

In the embodiment shown in FIG. 3B, thermal vias 141 that do not electrically couple the power layers 140 to the cold plate assembly 110 are provided to provide a thermal path between the first insulation layer 122 of the printed circuit board 120. The thermal vias 141 may be fabricated from any thermally conductive material, such as copper and silver, for example, The thermal vias 141 may be fabricated by three-dimensional printing, for example.

Figure 3C:
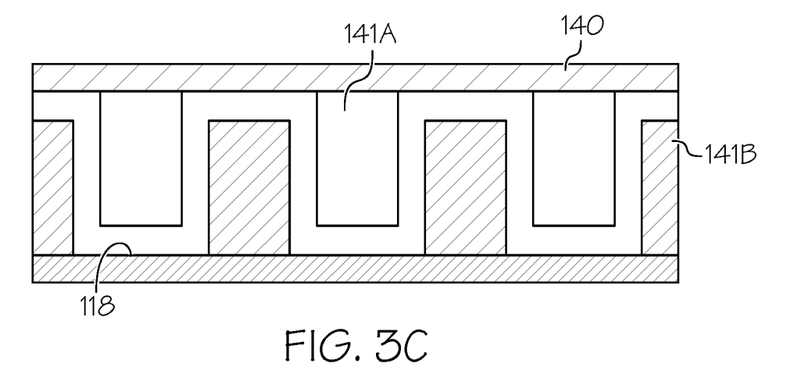
FIG. 3C schematically depicts a side view of thermal vias of the electronics assembly shown in FIG. 3B according to one or more embodiments described and illustrated herein.
Figure 3D:
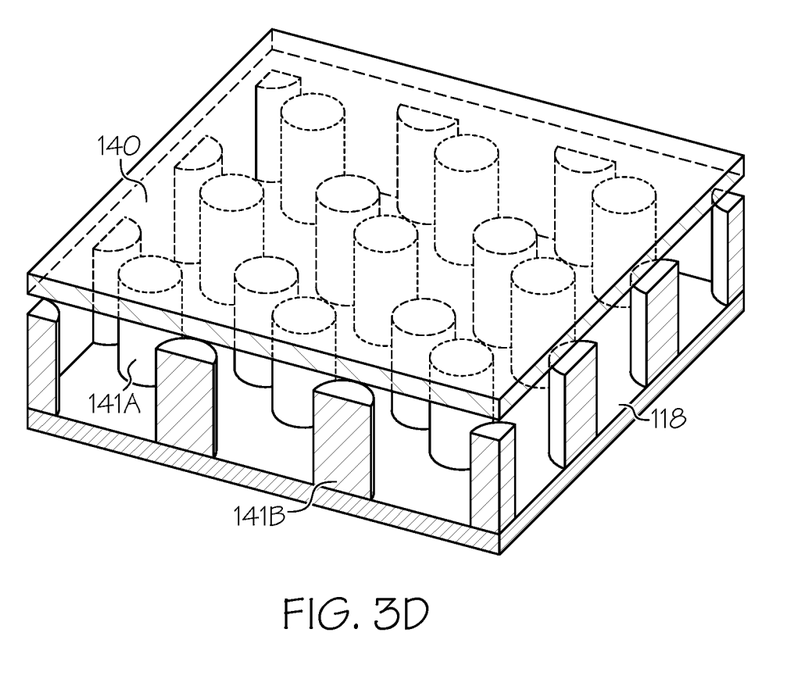
FIG. 3D schematically depicts a perspective view of the thermal vias shown in FIG. 3C according to one or more embodiments described and illustrated herein.

FIG. 3C illustrates a partial close up side view and FIG. 3D illustrates a partial perspective view of the thermal vias 141 depicted in FIG. 3B. A first set of thermal vias 141A extend from the power layer 140 through the first insulation layer 122 and toward the surface 118 of the cold plate assembly 110. A second set of thermal vias 141B extend from the surface 118 of the cold plate assembly 110 through the first insulation layer 122 and toward the power layer 140. The first set of thermal vias 141A and the second set of thermal vias 141B are collectively referred to herein as thermal vias 141. The first set of thermal vias 141A and the second set of thermal vias 141B are vertically offset such that the two sets of vias are interlaced and do not contact one another. Thus, the first set of thermal vias 141A and the second set of thermal vias 141B provide thermal paths that do not electrically couple the power layer 140 to the cold plate assembly 110. The thermal vias 141 lower the thermal resistance of the electronic assembly 100 and provide thermal paths for heat generated within the power layers 140 to flow toward the cold plate assembly 110 where it may be removed from the electronics assembly 100 by circulating cooling fluid.

It should be understood that any number of thermal vias 141 may be provided to thermally couple any number of power layers 140 to the cold plate assembly 110. The thermal vias 141 compensate for the lower thermal conductivity of the three-dimensionally printed materials as compared to traditional laminated printed circuit board materials (e.g., FR4 and copper).

Figure 4A:
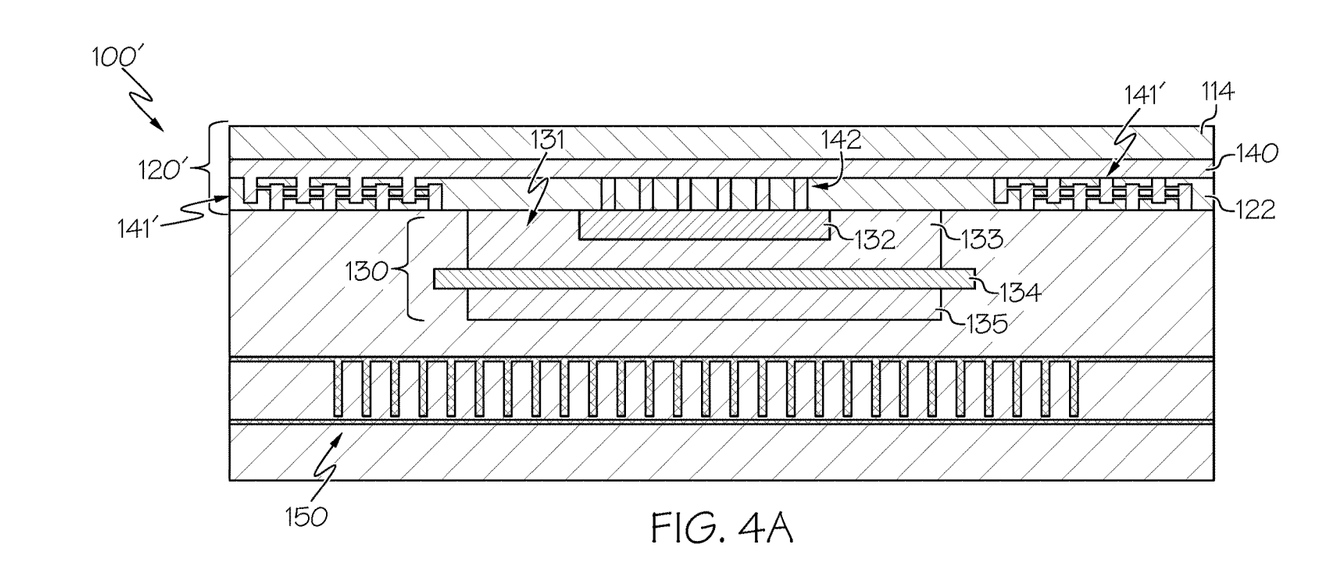
FIG. 4A schematically depicts a close-up view of a power electronic assembly and a power layer of another example electronics assembly according to one or more embodiments described and illustrated herein.
Figure 4B:
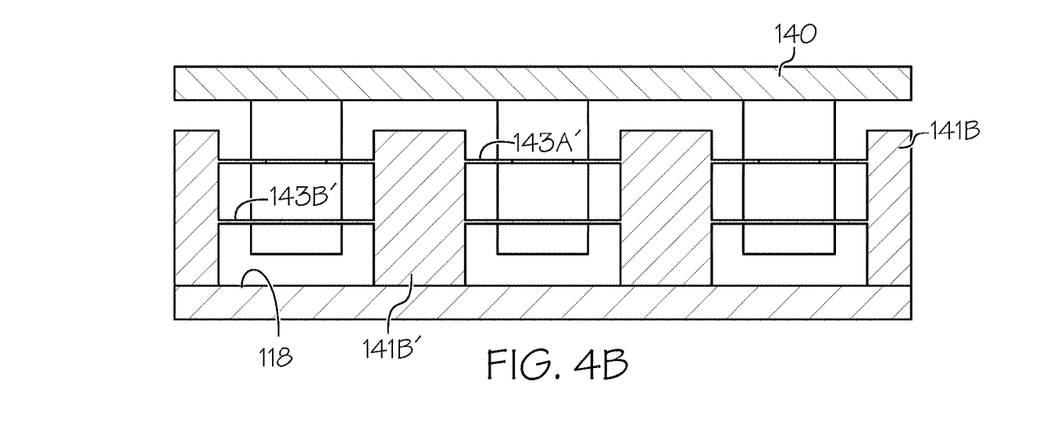
FIG. 4B schematically depicts a side view of thermal vias of the electronics assembly shown in FIG. 4A according to one or more embodiments described and illustrated herein.
Figure 4C:
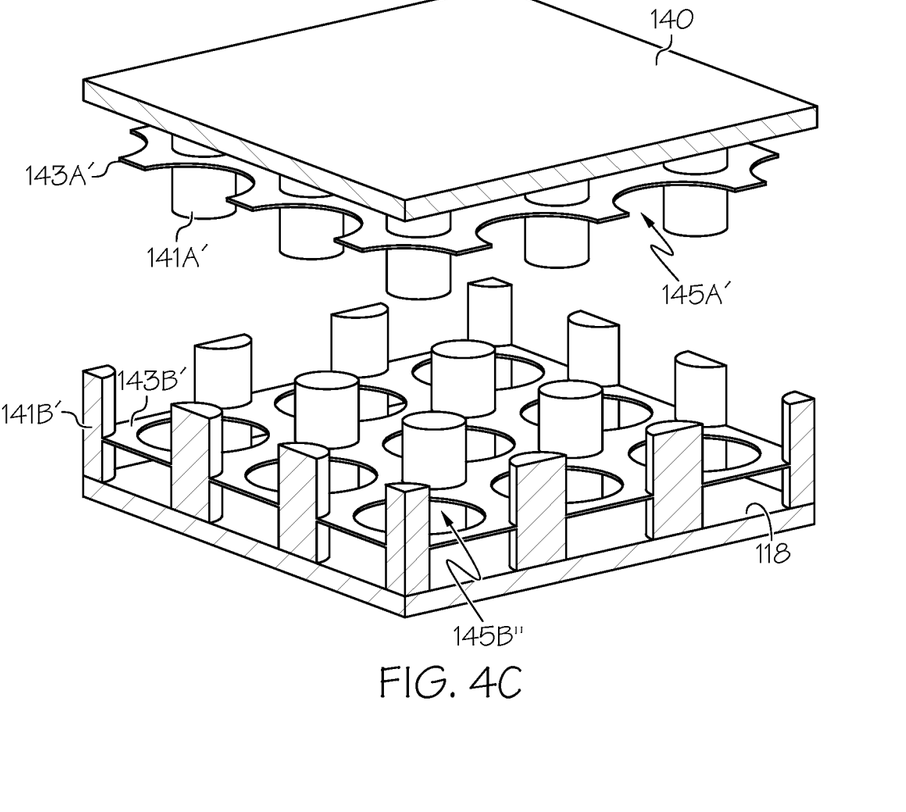
FIG. 4C schematically depicts a perspective view of the thermal vias shown in FIG. 4B according to one or more embodiments described and illustrated herein.

Referring now to FIG. 4A, a close-up view of another electronics assembly 100' is illustrated. The electronic assembly has a three-dimensionally printed circuit board 120' that is similar to the printed circuit board 120 of FIGS. 3B-3D except the thermal vias 141' have a different configuration. FIG. 4B is a close-up side view and FIG. 4C is a close-up perspective view of the thermal vias 141' depicted in FIG. 4A. A first set of thermal vias 141A' extend from the power layer 140 through the first insulation layer 122 and toward the surface 118 of the cold plate assembly 110. A second set of thermal vias 141B' extend from the surface 118 of the cold plate assembly 110 through the first insulation layer 122 and toward the power layer 140. The first set of thermal vias 141A' and the second set of thermal vias 141B' are collectively referred to herein as thermal vias 141'. The first set of thermal vias 141A' and the second set of thermal vias 141B' are vertically offset such that the two sets of vias are interlaced and do not contact one another.

In the example of FIGS. 4A-4C, a first electrically conductive plate 143A' is electrically coupled to the first set of thermal vias 141A' and has a first set of openings 145A'. Additionally, a second electrically conductive plate 143B' is electrically coupled to the second set of thermal vias 141B' and has a second set of openings 145B'. The first set of thermal vias 141A' are disposed within the second set of openings 145B', and the second set of thermal vias 141B' are disposed within the first set of openings 145A' such that the first electrically conductive plate and the second electrically conductive plate are electrically isolated from one another.

The first and second electrically conductive plates 143A', 143B' provide additional volume and surface area for thermal conductivity to lower the thermal resistance of the electronics assembly 100' without shorting the power layers 140 to the cold plate assembly 110.

Figure 5:
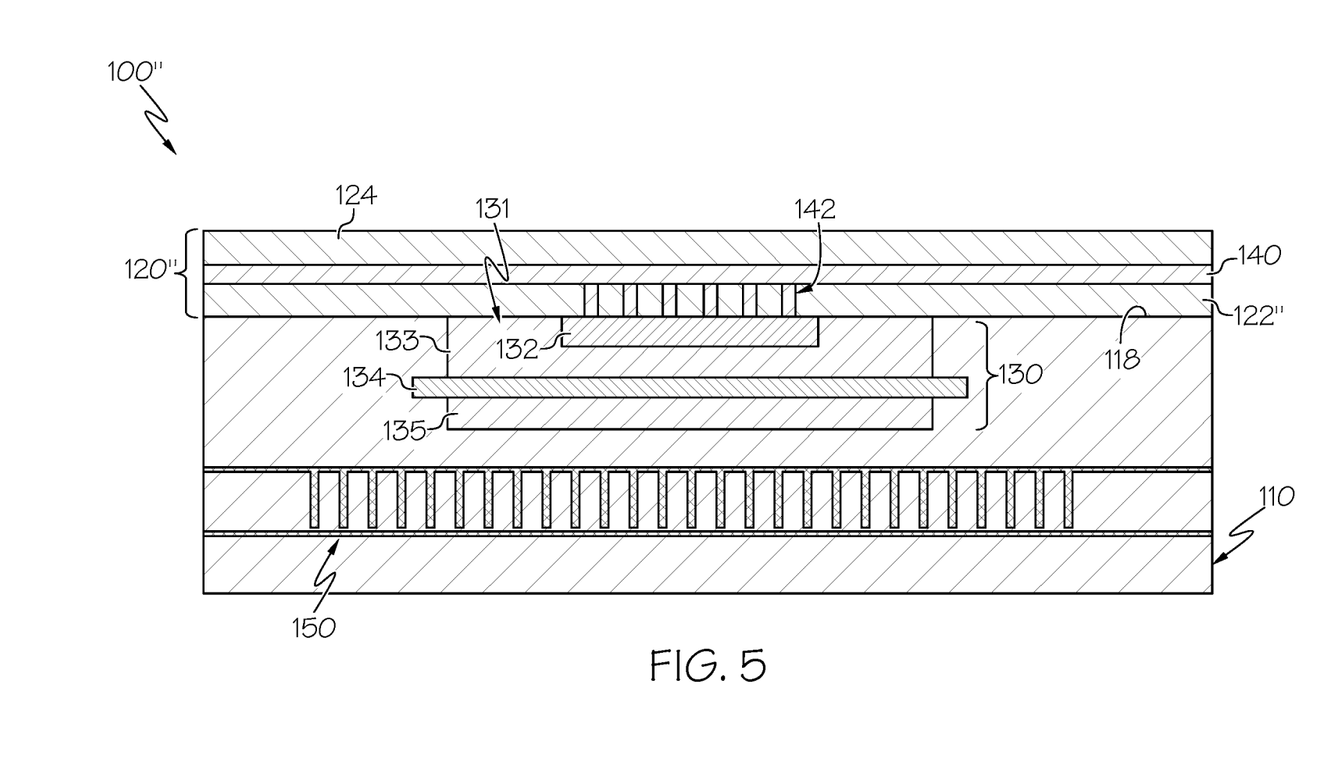
FIG. 5 schematically depicts a close-up view of a power electronic assembly and a power layer of another example electronics assembly according to one or more embodiments described and illustrated herein.

FIG. 5 illustrates another electronics assembly 100" that reduces the joule heating and lowers the thermal resistance between the power layer 140 and the cold plate assembly 110. In this example, the first insulation layer 122" of the printed circuit board 120" is fabricated by three-dimensionally printing a high thermally conductive material, such as a ceramic. Non-limiting examples of high thermally conductive material include alumina and zirconia. In some embodiments, thermal vias, such as the thermal vias 141 of FIGS. 3B-3D and/or the thermal vias 141' of FIGS. 4A-4C are provided in the high thermally conductive material first insulation layer 122".

In some embodiments, another solution is to reduce the joule heating by increasing the electrical current flow cross-section. For three-dimensionally printed power layers, there is usually a maximum thickness that the three-dimensional printer can print, e.g. 100 μm. To reduce the joule heating from the power layers, the cross-section of the power layers may be increased, e.g. increase trace width and thickness. However, increasing the power layer trace width would lead to a larger printed circuit board footprint, which would lower the system power density. Therefore, to avoid a larger printed circuit board footprint while reducing joule heating, multiple power layers could be printed in a Z direction to increase the current flow cross-section so that lower joule heating is achieved compared to single power layer 120.

Figure 6:
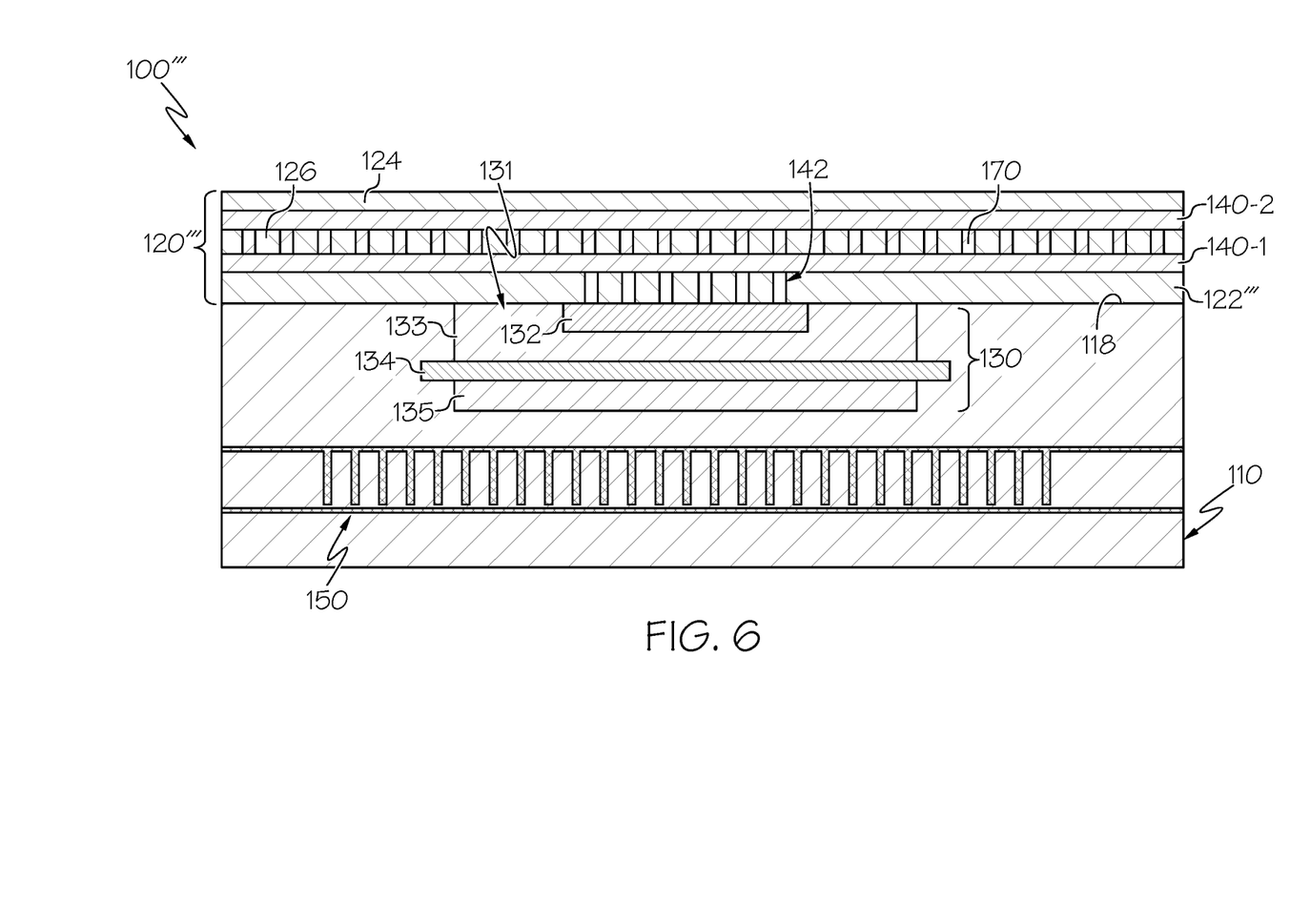
FIG. 6 schematically depicts a close-up view of a power electronic assembly and a power layer of another example electronics assembly according to one or more embodiments described and illustrated herein.

FIG. 6 illustrates an example electronics assembly 100''' having a printed circuit board 120''' with a power layer stack defined by an upper power layer 140-1 and a lower power layer 140-2 that are electrically and thermally coupled to one another by a plurality of vias 170. Thus, the printed circuit board 120''' is defined by a first insulation layer 122''', which may be made of a high thermal conductivity ceramic, such as alumina or zirconia, a lower power layer 140-2, a middle insulation layer 126, a plurality of thermal vias 170, an upper power layer 140-2, and an upper insulation layer (i.e., a second insulation layer). The upper power layer 140-1 and lower power layer 140-2 act as one power layer having increased cross-sectional area to reduce joule heating within the printed circuit board 120'''.

Figure 7:
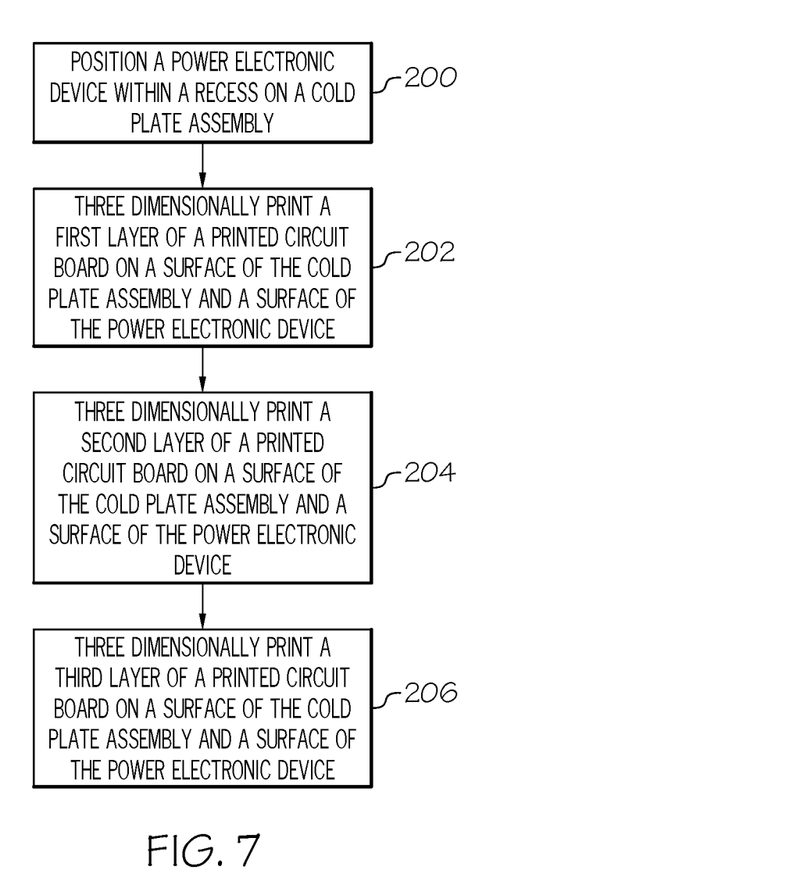
FIG. 7 illustrates a flowchart of a process for fabricating an electronics assembly according to one or more embodiments described and illustrated herein.

Embodiments of the present disclosure also provide for methods of fabricating the electronics assemblies described herein. The methods involve three-dimensionally printing the printed circuit boards described herein on a surface of a cold plate assembly as well as directly on power electronic devices maintained within power electronic assemblies. FIG. 7 illustrates a flowchart of an example method for fabricating an electronic assembly as described herein. In a first step 200, a power electronic device is positioned within a recess of a surface of a cold plate assembly. Prior to positioning the power electronic device into the recess of the cold plate assembly, the power electronic device may be disposed within a first metal layer of a direct bonded metal substrate, and then the power electronic device and the direct bonded metal substrate may be positioned within the recess of the surface of the cold plate assembly.

In step 202, a first layer of a printed circuit board is three-dimensionally printed on the surface of the cold plate assembly and a surface of the power electronic device. The first layer comprises an insulation material, a first set of thermal vias within the insulation material and extending from a surface of the first layer toward the surface of the cold plate assembly, and a second set of thermal vias within the insulation material and extending from the surface of the cold plate assembly toward the surface of the first layer.

In step 204, a second layer of the printed circuit board is three-dimensionally printed on the surface of the first layer. The second layer is an electrically conductive material that defines an electrically conductive power layer that contacts the first set of thermal vias.

In step 206, a third layer of the printed circuit board is three-dimensionally printed on the surface of the second layer. The third layer is an electrically insulating material.

It is noted that the method of FIG. 7 may be performed to fabricate any of the electronic assemblies described and illustrated herein.

It should now be understood that embodiments of the present disclosure reduce joule heating in dense electronic assemblies having a three-dimensionally printed circuit board by a variety of techniques. For example, sets of thermal vias that are electrically isolated from one another provide an enhanced thermal path between a power layer and a cold plate assembly. Further, high thermal conductivity materials, such as ceramics, may be used as an insulator layer material. Additionally, stacked power layers may be electrically coupled together by vias to increase the cross-sectional area of the power layers of the electronic assembly to reduce thermal and electrical resistance, and thereby reduce joule heating.

While particular embodiments have been illustrated and described herein, it should be understood that various other changes and modifications may be made without departing from the spirit and scope of the claimed subject matter.

Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. An electronics assembly comprising:
   a cold plate assembly having a first surface;
   at least one power electronic device disposed within a recess on the first surface of the cold plate assembly; and
   a printed circuit board disposed on a surface of the at least one power electronic device, the printed circuit board comprising:
      a first insulation layer;
      a second insulation layer;
      an electrically conductive power layer between the first insulation layer and the second insulation layer;
      a first set of thermal vias extending from the electrically conductive power layer and toward the first surface of the cold plate assembly; and
      a second set of thermal vias extending from the first surface of the cold plate assembly toward the electrically conductive power layer, wherein the first set of thermal vias is electrically isolated from the second set of thermal vias;
      a first electrically conductive plate electrically coupled to the first set of thermal vias and comprising a first set of openings, wherein the second set of thermal vias are disposed within the first set of openings; and
      a second electrically conductive plate electrically coupled to the second set of thermal vias and comprising a second set of openings, wherein the first set of thermal vias are disposed within the second set of openings such that the first electrically conductive plate and the second electrically conductive plate are electrically isolated from one another.

2. The electronics assembly of claim 1, wherein the first set of thermal vias and the second set of thermal vias are interlaced with respect to one another.

3. The electronics assembly of claim 1, wherein the printed circuit board further comprises one or more electrical vias electrically coupled to the at least one power electronic device and the electrically conductive power layer.

4. The electronics assembly of claim 1, further comprising a direct bonded metal substrate assembly comprising a first metal layer, a ceramic layer and a second metal layer, wherein the ceramic layer is positioned between the first metal layer and the second metal layer, and the at least one power electronic device is disposed in a recess of the first metal layer.

5. The electronics assembly of claim 1, further comprising gate drive devices positioned on a surface of the printed circuit board.

6. The electronics assembly of claim 1, wherein the cold plate assembly comprises:
   a chamber, wherein the at least one power electronic device is located above the chamber;
   a fluid inlet fluidly coupled to the chamber;
   a fluid outlet fluidly coupled to the chamber; and
   a plurality of first fins disposed within the chamber extending in a first lateral direction.

7. An electronics assembly comprising:
   a cold plate assembly having a first surface and six recesses within the first surface;
   three pairs of power electronic devices disposed within the six recesses, each power electronic device of the three pairs of power electronic devices comprising a collector and an emitter;
   a printed circuit board disposed on a surface of the three pairs of power electronic devices, the printed circuit board comprising:
      a first insulation layer;
      a second insulation layer;
      for each pair of power electronic devices, an electrically conductive output power layer between the first insulation layer and the second insulation layer, wherein the electrically conductive output power layer is electrically coupled to the collector of one power electronic device of the pair of power electronic devices and the emitter of the other power electronic device of the pair of power electronic devices;
      an electrically conductive positive power layer between the first insulation layer and the second insulation layer, wherein the electrically conductive positive power layer is electrically coupled to the collector of a first power electronic device of each of the three pairs of power electronic devices;
      an electrically conductive negative power layer between the first insulation layer and the second insulation layer, wherein the electrically conductive negative power layer is electrically coupled to the emitter of a first power electronic device of each of the three pairs of power electronic devices;
      a first set of thermal vias extending from one or more of the electrically conductive positive power layer, the electrically conductive negative power layer, and one or more of the electrically conductive output power layers; and
      a second set of thermal vias extending from the first surface of the cold plate assembly, wherein the first set of thermal vias is electrically isolated from the second set of thermal vias.

8. The electronics assembly of claim 7, wherein the first set of thermal vias and the second set of thermal vias are interlaced with respect to one another.

9. The electronics assembly of claim 7, wherein the printed circuit board further comprises:
   a first electrically conductive plate electrically coupled to the first set of thermal vias and comprising a first set of openings, wherein the second set of thermal vias are disposed within the first set of openings; and
   a second electrically conductive plate electrically coupled to the second set of thermal vias and comprising a second set of openings, wherein the first set of thermal vias are disposed within the second set of openings such that the first electrically conductive plate and the second electrically conductive plate are electrically isolated from one another.

10. The electronics assembly of claim 7, further comprising three pairs of direct bonded metal substrate assemblies, each direct bonded metal substrate comprising a first metal layer, a ceramic layer and a second metal layer, wherein the ceramic layer is positioned between the first metal layer and the second metal layer, and an individual power electronic device of the three pairs of power electronic devices is disposed in a recess of the first metal layer.

11. The electronics assembly of claim 7, further comprising gate drive devices positioned on a surface of the printed circuit board.

12. The electronics assembly of claim 7, wherein the cold plate assembly comprises:

a chamber, wherein the three pairs of power electronic devices are located above the chamber;
a fluid inlet fluidly coupled to the chamber;
a fluid outlet fluid fluidly coupled to the chamber; and
a plurality of first fins disposed within the chamber extending in a first lateral direction.

13. A method of fabricating an electronics assembly, the method comprising:
positioning a power electronic device within a recess on a surface of a cold plate assembly;
three dimensionally printing a first layer on the surface of the cold plate assembly and a surface of the power electronic device, wherein the first layer comprises an insulation material, a first set of thermal vias within the insulation material and extending from a surface of the first layer toward the surface of the cold plate assembly, and a second set of thermal vias within the insulation material and extending from the surface of the cold plate assembly toward the surface of the first layer, wherein the first set of thermal vias is electrically isolated from the second set of thermal vias;
a first electrically conductive plate electrically coupled to the first set of thermal vias and comprising a first set of openings, wherein the second set of thermal vias are disposed within the first set of openings;
a second electrically conductive plate electrically coupled to the second set of thermal vias and comprising a second set of openings, wherein the first set of thermal vias are disposed within the second set of openings such that the first electrically conductive plate and the second electrically conductive plate are electrically isolated from one another;
three dimensionally printing a second layer on the surface of the first layer, wherein the second layer is an electrically conductive material that defines an electrically conductive power layer that contacts the first set of thermal vias; and
three dimensionally printing a third layer on the first layer, wherein the third layer is an electrically insulating material.

14. The method of claim 13, wherein the first set of thermal vias and the second set of thermal vias are interlaced with respect to one another.

15. The method of claim 13, wherein the first layer further comprises one or more electrical vias electrically coupled to the power electronic device and the electrically conductive power layer.

16. The method of claim 13, further comprising, prior to positioning the power electronic device within the recess on the surface of the cold plate assembly, positioning the power electronic device within a direct bonded metal substrate assembly comprising a first metal layer, a ceramic layer and a second metal layer, wherein the ceramic layer is positioned between the first metal layer and the second metal layer, and the power electronic device is disposed in a recess of the first metal layer.

17. An electronics assembly comprising:
a cold plate assembly having a first surface;
at least one power electronic device disposed within a recess on the first surface of the cold plate assembly;
a printed circuit board disposed on a surface of the at least one power electronic device, the printed circuit board comprising:
a first insulation layer;
a second insulation layer;
an electrically conductive power layer between the first insulation layer and the second insulation layer;
a first set of thermal vias extending from the electrically conductive power layer and toward the first surface of the cold plate assembly; and
a second set of thermal vias extending from the first surface of the cold plate assembly toward the electrically conductive power layer, wherein the first set of thermal vias is electrically isolated from the second set of thermal vias; and
a direct bonded metal substrate assembly comprising:
a first metal layer;
a ceramic layer; and
a second metal layer, wherein the ceramic layer is positioned between the first metal layer and the second metal layer, and the at least one power electronic device is disposed in a recess of the first metal layer.

* * * * *